United States Patent

Chang et al.

[11] Patent Number: 6,024,274
[45] Date of Patent: Feb. 15, 2000

[54] METHOD FOR TAPE AUTOMATED BONDING TO COMPOSITE BUMPS

[75] Inventors: Shyh-Ming Chang, Shinchu; Shyuan-Jeng Ho, Hsinchu; Yu-Chi Lee, Taipei; Jen-Huang Jeng, Hsinchu; Pao-Yun Tang, Hsinchu; Su-Yu Fang, Hsinchu, all of Taiwan

[73] Assignee: Industrial Technology Research Institute, Hsinchu, Taiwan

[21] Appl. No.: 08/627,134

[22] Filed: Apr. 3, 1996

[51] Int. Cl.⁷ .................................................. H01L 21/44
[52] U.S. Cl. ...................... 228/180.22; 257/737; 438/614
[58] Field of Search .............................. 228/180.22, 176, 228/180.21; 257/737; 438/613, 614

[56] References Cited

U.S. PATENT DOCUMENTS

| | | | |
|---|---|---|---|
| 3,922,712 | 11/1975 | Stryker | 257/737 |
| 4,585,157 | 4/1986 | Belcher. | |
| 5,166,099 | 11/1992 | Ueda et al. | 228/180.21 |
| 5,393,697 | 2/1995 | Chang et al. | 438/613 |
| 5,532,186 | 7/1996 | Kobayashi | 228/180.22 |
| 5,707,902 | 1/1998 | Chang et al. | 438/614 |

OTHER PUBLICATIONS

Ward "Pressure Contact Type Chip Join Technique", IBM Technical Disclosure Bulletin, vol. 18 No. 9, p. 2817, Feb. 1976.

*Primary Examiner*—Kenneth J. Ramsey
*Attorney, Agent, or Firm*—Tung & Associates

[57] ABSTRACT

A tape automated bonding (TAB) process in which a tape-carrier through its finger leads is bonded to composite bumps on an IC chip wherein the composite bumps are constructed by a polymeric material layer and at least one metal layer. The polymeric material layer has a lower rigidity (or a lower Young's modules) than those of the metal layers. Structural damages during the bonding process that is frequently caused by a rigid metal bump is eliminated. The TAB bonding process can be carried out by using either an all-metal lead frame, a plated metal lead frame, or a polymer reinforced metal lead frame. The polymer/metal composite bumps constructed on the IC chip require a smaller bonding force when bonded in a thermal bonder.

11 Claims, 3 Drawing Sheets

METHOD FOR TAPE AUTOMATED BONDING TO COMPOSITE BUMPS

FIELD OF THE INVENTION

The present invention generally relates to a method of bonding integrated circuit (IC) chips to a lead frame tape and more particularly, is related to a method of bonding integrated circuit chips equipped with composite bumps to a lead frame tape.

BACKGROUND OF THE INVENTION

In recent years, techniques of using an automated tape bonding process in packaging integrated circuit chips have been developed. The technique is used to replace other lead frame wire bonding methods used in packaging integrated circuit chips.

In a tape bonding process, an integrated circuit chip is directly bonded to a foil-type lead frame that is usually less than 0.5 mm in thickness. The technique is also referred to as tape automated bonding or TAB. In a TAB process, a bare copper, a gold or tin plated copper or a copper/plastic laminated tape is first prepared by etching leads into it at positions corresponding to the gold plated bumps over aluminum bonding pads on an integrated circuit chip. The tape is then fed into an inner lead bonder, which is an apparatus equipped with a thermode, i.e., a heated instrument that presses the chip and the tape together. The inner end of the leads are bonded to the bumps on the integrated circuit chip by compressing them under the heated thermode in a single operation. The integrated circuit chip and bonded leads can then be excised out of the tape for connection to a circuit board.

As shown in FIG. 1, a length of copper tape 10 is loaded into an inner lead bonder machine between thermode 12 and anvil 14. An integrated circuit chip 16 is provided and positioned on the flat top 18 of anvil 14 with gold tipped or solder tipped contact bumps 20. Contact bumps 20 face upward. An electric resistance heating coil 22 is used to heat thermode 12 of the inner lead bonder. A suitable copper tape used in this process is a 0.0028 inch thick non-plated copper of 2 oz. weight supplied by the Minnesota Mining and Manufacturing Co. A gold or tin plated copper tape, or a copper/plastic laminated tape may also be used.

In the conventional tape automated bonding technique, contact bumps 20 are made by first building up an aluminum pad to about 1200 $\mu$m in height. The aluminum contact bump is then covered with sputtered layers of titanium and an alloy of tungsten. Each layer is about 200–300 $\mu$m thick and has a combined thickness of about 500 $\mu$m. A thin layer of about 400 $\mu$m of gold is then sputtered on top of the contact bump. In a final processing step, a gold layer of 0.001 inch (or 25,400 $\mu$m) in thickness is plated on top of the sputtered gold layer.

Thermode 12 is then lowered to contact tape 10 and integrated circuit chip 16. FIG. 2 shows thermode 12 in a closed position wherein etched finger leads 24 in tape 10 are pressed against gold tipped or solder tipped bumps 20 between thermode surface 26 and anvil surface 18. The usual time, temperature, and bonding pressure used are 0.8 sec, 525° C., and 200 gms/bump respectively. However, it is to be understood that bonding pressure can be adjusted based on the heat input from heating coil 22 and the time desired for each particular bonding process.

In a conventional TAB method using gold plated aluminum bumps, the high rigidity of the metal necessitates a high bonding force between the IC chip and the lead frame. The high bonding force frequently causes crack formations in the chip at the base of a bump.

It is therefore an object of the present invention to provide a TAB bonding method to bond a lead frame to an IC chip that does not have the drawbacks and shortcomings of the prior art methods.

It is another object of the present invention to provide a method of TAB bonding wherein a lead frame is bonded to bumps on an IC chip that have reduced rigidity.

It is a further object of the present invention to provide a method of TAB bonding a lead frame to bumps on an IC chip wherein the bumps are constructed of a composite material.

It is another further object of the present invention to provide a TAB bonding method wherein a lead frame is bonded to bumps on a IC chip that are constructed of a polymer/metal composite.

It is yet another object of the present invention to provide a TAB bonding method in which a lead frame is bonded to composite bumps on an IC chip without causing any crack formation in the chip.

It is still another object of the present invention to provide a TAB bonding method wherein a lead frame is bonded to a composite bumps on an IC chip without any structural damage occurring during the bonding process.

SUMMARY OF THE INVENTION

In accordance with the present invention, a method for tape automated bonding wherein an integrated circuit equipped with composite bumps is bonded to the finger leads situated in a lead frame. The composite bumps are constructed of a polymeric material and a metallic material. The polymeric component of the composite bump has a lower rigidity compared to that of the metal.

In a preferred embodiment, the present invention method can be carried out by providing a metal lead frame having a polymer reinforcement laminated on top is bonded to composite bumps on an integrated circuit chip. The composite bumps are constructed by first building a metal pad in a top surface layer of an IC chip, a metal based layer is then deposited on top of and in electrical communication with the metal pad layer. After a polymer layer is coated on top of the metal based layer, a photoresist layer is coated, exposed and developed such that the photoresist layer only covers the portion of the polymer necessary for building a composite bump. The polymer layer is then etched away to leave a polymer stump for the composite bump, and the photoresist is subsequently removed. A second metal layer is then deposited on top of the polymer stump and the first metal layer. Through a second photoresist, exposure, and developing process, the metal layer is etched away with only metal remaining on top of the polymer stump necessary for building the composite bump. The photoresist layer on top of the second metal layer is subsequently removed and a composite bump with a polymer stump sandwiched in between two metal layers and built on a metal pad is obtained.

In alternate embodiments, a lead frame tape is provided which has a polymeric reinforcement layer laminated to the bottom of the metal tape, or a continuous polymeric reinforcement layer is laminated to the top of the metal layer with no openings in the polymeric layer. The first alternate embodiment provides the benefit of space savings with the reinforcing polymeric tape not taking up space on top of the metal tape. The second alternate embodiment provides the benefit that the I/O pads can be arranged at any position, even though the bonding temperature is limited due to the continuous polymeric reinforcement layer.

The present invention is further directed to integrated circuit chips that are bonded in a TAB process to a metal lead frame wherein composite bumps are utilized on the chips to provide chips without structural damage.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENTS

The present invention provides a novel method of tape automated bonding in which a lead frame of various constructions can be bonded to an integrated circuit chip that is equipped with metal/polymeric composite bumps. The polymer component in the composite bump has substantially less rigidity compared to the metal component and therefore, requires smaller bonding force when bonded under heat and pressure to a finger lead in a lead frame. The processing difficulties such as the formation of cracks in an IC chip at the base of a bump frequently seen in bonding all-metal bumps to a lead frame can be avoided.

The polymeric component in the composite bump can be made of various polymeric materials such as polyimide, polyester, epoxy, or any other suitable polymeric materials. Various metallic materials can be used for the metallic component of the composite bump such as aluminum, copper, nickel, silver, tungsten, platinum, palladium and gold. A layer of gold or tin coating is frequently applied on top of the composite bump to prevent oxidation.

Figure 3A:
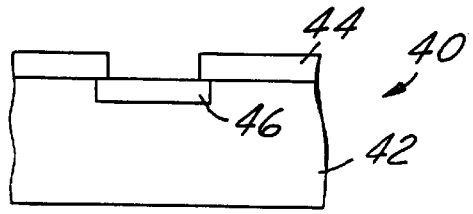
FIGS. 3a–3k show enlarged cross-sectional views of the processing steps required for building a composite bump on an IC chip.
Figure 3B:
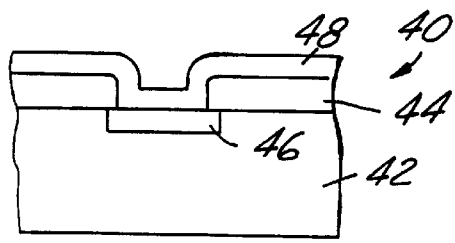
Figure 3C:
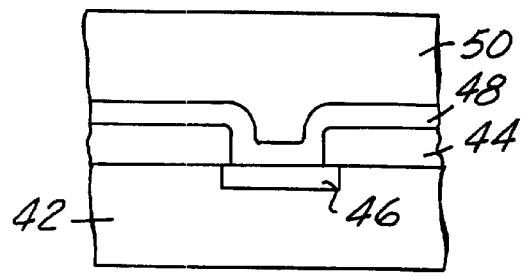

Referring initially to FIGS. 3a through 3k wherein processing steps for forming a composite bump in both a preferred and an alternate embodiment is shown. In FIG. 3a, an integrated circuit chip 40 is built on a substrate 42. A passivation layer 44 and an aluminum input/output pad 46 of approximately 90 microns in diameter is first formed on the substrate 42. A conductive metal 48 is deposited on top of the passivation layer 44 in contact with the aluminum input/output pad 46. A polymer layer 50 having a thickness of approximately between about 5 microns and 25 microns is formed on the metal layer 48. A suitable polymer for this purpose is polyimide such as that supplied by OCG Microelectroic Materials, Inc. of Tempe, Ariz. under the code of Probimide 7010 or 514. This is shown in FIG. 3c.

Figure 3D:
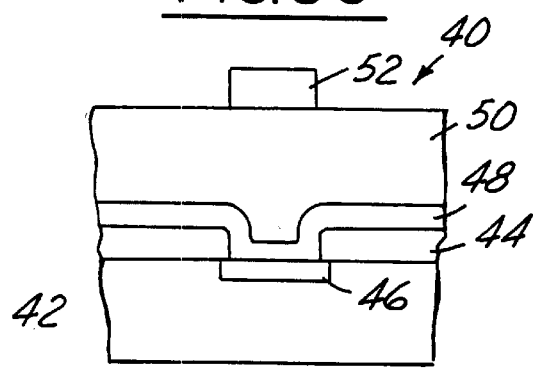
Figure 3E:
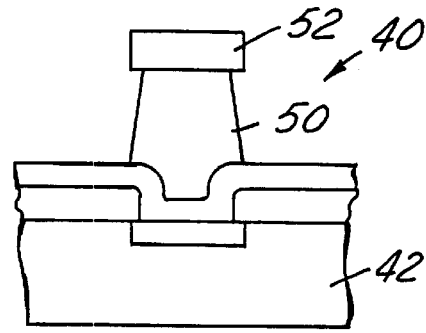
Figure 3F:
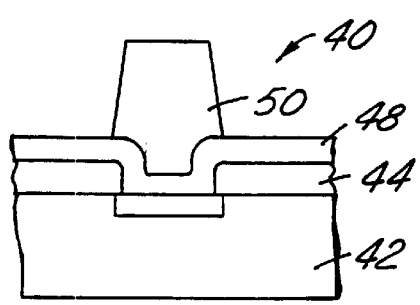
Figure 3G:
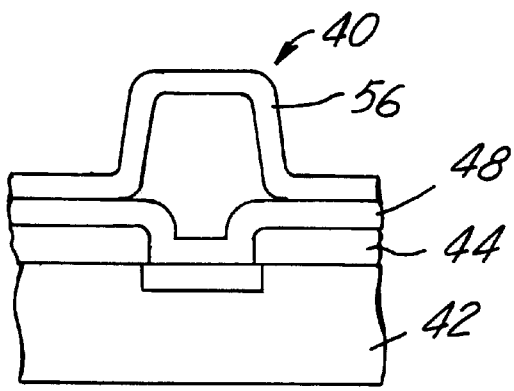

Next, a photoresist pattern 52 is formed, exposed, and developed on the polymer layer 50. As shown in FIGS. 3d and 3e, the polymer layer 52 is etched to a predetermined photoresist pattern by using MF-319 at room temperature for between about 1 and about 3 minutes. The patterning and etching of polyimide films can be found in Chapter 8 of Polyimides edited by Wilson, Stenzenberger, and Hergenrother published by Blackie and Son Ltd. (1990). The photoresist layer 52 is then stripped, as shown in FIG. 3f, and a conductive metal layer 56 such as a composite of chromium/gold having a chromium thickness of about 500 Å and a gold thickness of about 2,000 Å is deposited on top of IC chip 40. This is shown in FIG. 3g. The coating layer 56 can also be a single metal such as aluminum or nickel, a composite such as nickel/gold, chromium/silver, or chromium/platinum. The conductive metal coating layer 56 can also be a composite that includes an adhesion layer/barrier layer/conductor layer such as chromium/copper/gold, chromium/nickel/gold, chromium/silver/gold, titanium/platinum/gold, titanium/palladium/gold, or titanium/tungsten/silver. A solder layer may further be coated on top of the gold layer.

Figure 3H:
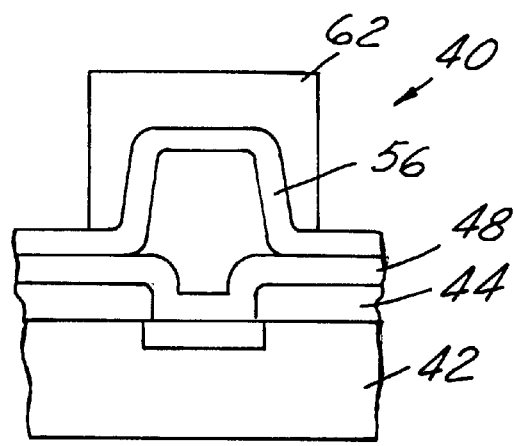
Figure 3I:
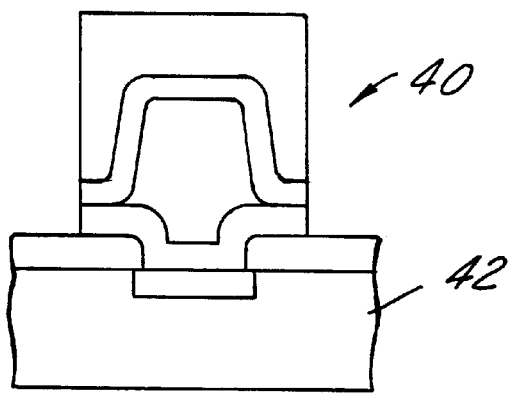
Figure 3J:
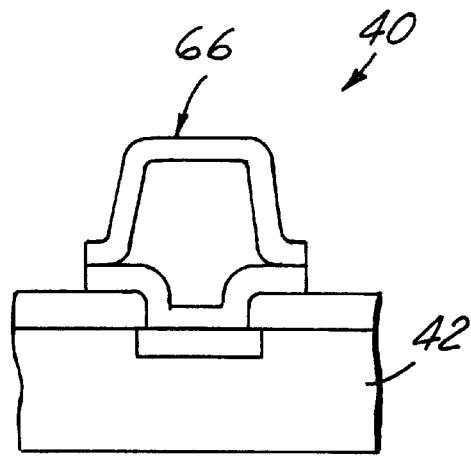

A pattern layer of photoresist 62 as shown in FIG. 3h, is then formed on the conductive metal layer 56. The conductive metal layer 56 is subsequently etched to the pattern of the photoresist 62, as shown in FIG. 3i. The photoresist layer 62 is then stripped, FIG. 3j, and the composite bump 66 is formed on IC chip 40. It has been found that for a chromium/gold conductive metal layer, suitable etching can be carried out by using one gm of $Cl(SO_4)_2 \cdot 2(NH_4)_2 SO_4 \cdot 2H_2O$+5 ml $HNO_3$+25 ml $H_2O$ at 28° C. for etching the chromium layer at a rate of about 8.5 $\mu m/min$. The gold layer can be etched by 4 gm of $KI$+1 gm $I_2$+40 ml $H_2O$ at room temperature at an etch rate between about 0.5 and 1 microns/min. The aluminum layer 48 shown in FIG. 3h can be etched by using $H_3PO_4:CH_3COOH:HNO_3:H_2O$ at a ratio of 4:4:1:1 at room temperature and an etch rate of about 35 $\mu m/min$.

Figure 3K:
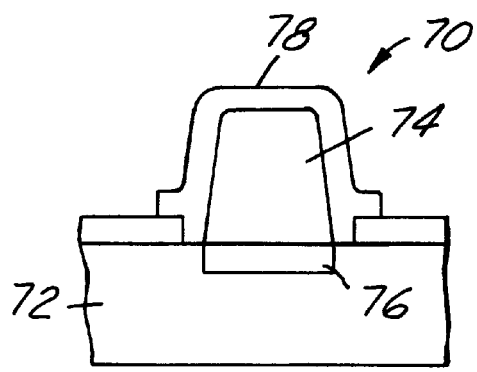

An alternate embodiment of the present invention composite bump can be constructed as shown in FIG. 3k wherein an IC chip 70 is built on a substrate 72. It is seen that the first metallic layer 48, shown in FIG. 3b, is eliminated in this embodiment. A polymer stump 74 is directly deposited on an aluminum I/O pad 76. The processing steps for the second metallic layer 78 are similar to that shown in the preferred embodiment above.

Figure 4:
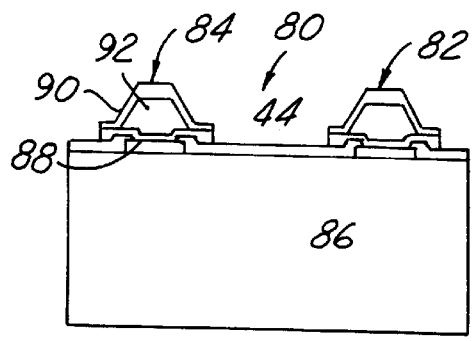
FIG. 4 is an enlarged cross-sectional view showing the structure of the present invention composite bump.

Referring now to FIG. 4, wherein an IC chip 80 with two composite bumps 82 and 84 is shown. The chip 80 is built on a substrate 86. It should be noted that in FIG. 4, a preferred embodiment which has two metal layers 88 and 90 is shown. The polymer stump 92 in bumps 84 and 82 provides a cushioning layer since the polymer, i.e. polyimide, has a smaller rigidity (or a smaller Young's modules) than those of the metal layers.

Figure 1:
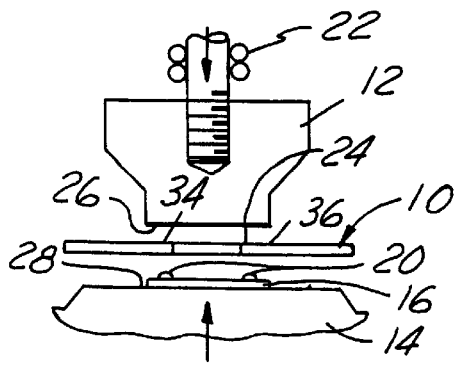
FIG. 1 is a schematic view showing a metal lead frame and an integrated circuit chip positioned under a thermode before a bonding process.
Figure 2:
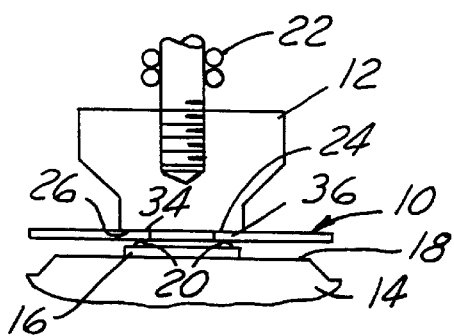
FIG. 2 is a schematic view showing the metal lead frame and the integrated circuit chip are compressed together in a thermode.
Figure 5:
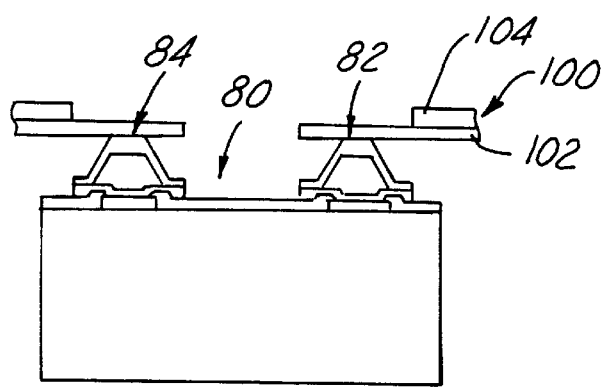
FIG. 5 is an enlarged cross-sectional view showing the preferred embodiment of the present invention in which a tape-carrier having a polymeric reinforcement layer laminated on top is bonded to composite bumps on an IC chip.

In the preferred embodiment, also shown in FIG. 5, a lead frame 100 which is constructed of a metal layer 102 and a polymer reinforcement layer 104 is provided. The lead frame 100 and the IC chip 80 are positioned in a thermal bonder such as that shown in FIG. 1 so that pressure and heat can be applied onto the lead frame 100 and the composite bumps 82 and 84. The tips of the finger leads facing the contact bumps may be coated with a metallic solder material. The advantages presented by this embodiment is that the inner lead bonding (ILB) process can stand a high bond temperature up to 500° C. However, it has the drawback of only been able to bond I/O pads at the peripheral edges of an IC chip.

Figure 6:
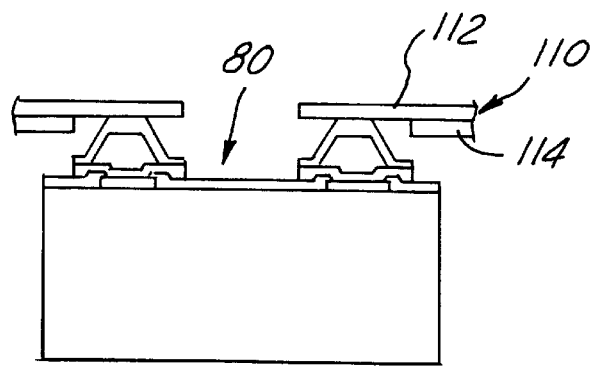
FIG. 6 is an enlarged cross-sectional view of an alternate embodiment of the present invention in which a tape-carrier having a polymeric reinforcement laminated on the bottom is bonded to composite bumps on an IC chip.

An alternate embodiment of the present invention TAB method for bonding a lead frame and an IC chip together is shown in FIG. 6. The lead frame 110 is constructed of a metallic layer 112 and a polymer reinforcement layer 114. The polymer layer is laminated to the bottom of the metal layer. The embodiment presents the benefit of requiring lesser space during processing since the polymer layer 114 does not occupy space on top of the metal layer 112.

Figure 7:
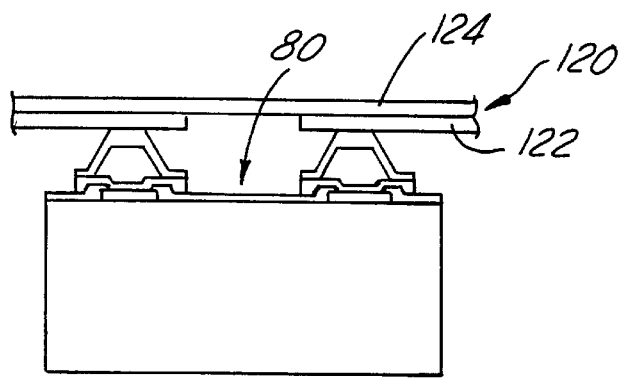
FIG. 7 is an enlarged cross-sectional view of another alternate embodiment of the present invention showing a tape-carrier having a continuous polymeric reinforcement layer laminated on top bonded to composite bumps on an IC chip.

In yet another alternate embodiment, shown in FIG. 7, a lead frame 120 is constructed by a metallic layer 122 and a continuous polymeric reinforcement layer 124 laminated on top of the metal layer. The embodiment provides a more versatile bonding method such that I/O pads can be bonded at any position on chip 80. It has one limitation that is lower bonding temperatures should be used due to limited heat dissipation allowed by the continuous polymer layer 124. A bonding temperature in the range of between 200° C. and about 500° C. can be used.

While the present invention has been described in terms of a preferred and several alternate embodiments thereof, it is to be appreciated that those skilled in the art will readily apply these teachings to other possible variations of the invention.

The embodiments of the invention in which an exclusive property or privilege is claimed are defined as follows:

What is claimed is:

1. A tape automated bonding method in which finger leads in a lead frame tape are bonded to contact bumps on an integrated circuit chip comprising the steps of:

providing a length of a lead frame tape having a plurality of finger leads etched therein, providing an integrated circuit chip having a plurality of contact bumps built on a top surface of said chip, said contact bumps been built with at least one layer of a polymeric material and at least one layer of a metallic material wherein the polymeric material being a polyester or an epoxy, and bonding said plurality of finger leads in said lead frame tape to said plurality of contact bumps on said IC chip.

2. A method according to claim 1, wherein the tips of said plurality of finger leads facing said contact bumps are coated with a metallic solder material.

3. A method according to claim 1, wherein said at least one metallic material is selected from the group consisting of aluminum, nickel, chromium, titanium and tungsten.

4. A method according to claim 1, wherein said at least one layer of a metallic material is selected from the group consisting of chromium/gold, nickel/gold, chromium/silver and titanium/platinum.

5. A method according to claim 1, wherein said at least one layer of a metallic material is selected from the group consisting of chromium/copper/gold, chromium/nickel/gold, chromium/silver/gold, titanium/platinum/gold, and titanium/palladium/gold.

6. A method according to claim 5 further comprising a solder layer adjacent to said gold layer.

7. A method according to claim 1, wherein said at least one layer of a metallic material comprises two layers of metals that are in electrical communication with a polymeric material sandwiched therebetween.

8. A method according to claim 1, wherein said lower rigidity of said polymeric materials enables a lower bonding force to be used in bonding said plurality of finger leads and said plurality of contact bumps together.

9. A method according to claim 1, wherein said bonding step is carried out in a thermode heated to a temperature of at least 200° C.

10. A method according to claim 1, wherein said bonding step is carried out by thermal and ultrasonic energy.

11. A method according to claim 1, wherein said lead frame tape comprises a copper layer and a polymeric reinforcement layer laminated together.

* * * * *